(12) United States Patent
Daudelin et al.

(10) Patent No.: US 8,780,666 B2
(45) Date of Patent: Jul. 15, 2014

(54) DECOUPLING CAPACITANCE CALIBRATION DEVICES AND METHODS FOR DRAM

(75) Inventors: Darin James Daudelin, Williston, VT (US); Bret Roberts Dale, Jericho, VT (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 243 days.

(21) Appl. No.: 13/340,691

(22) Filed: Dec. 30, 2011

(65) Prior Publication Data

US 2013/0170286 A1    Jul. 4, 2013

(51) Int. Cl.
*G11C 5/14* (2006.01)

(52) U.S. Cl.
USPC .......................................... 365/226; 327/536

(58) Field of Classification Search
USPC .......... 365/149, 226 O, 226; 327/536 X, 537, 327/536
See application file for complete search history.

(56) References Cited

U.S. PATENT DOCUMENTS

| | | | | |
|---|---|---|---|---|
| 5,905,398 | A * | 5/1999 | Todsen et al. | 327/337 |
| 5,914,633 | A * | 6/1999 | Comino et al. | 327/553 |
| 6,535,424 | B2 * | 3/2003 | Le et al. | 365/185.18 |
| 6,717,458 | B1 * | 4/2004 | Potanin | 327/536 |
| 6,721,910 | B2 * | 4/2004 | Ninomiya et al. | 714/718 |
| 6,898,538 | B2 * | 5/2005 | Tailliet | 702/79 |
| 6,949,967 | B2 * | 9/2005 | Wang et al. | 327/337 |
| 7,414,459 | B2 * | 8/2008 | Pisasale et al. | 327/543 |
| 7,622,972 | B2 * | 11/2009 | Dale et al. | 327/170 |
| 7,944,286 | B2 * | 5/2011 | Yoo | 327/553 |
| 2010/0013546 | A1 * | 1/2010 | Yoo | 327/513 |

* cited by examiner

*Primary Examiner* — Vanthu Nguyen
(74) *Attorney, Agent, or Firm* — Winston Hsu; Scott Margo

(57) ABSTRACT

A decoupling capacitance (decap) calibration device includes a plurality of parallel decoupling capacitors configured to be electrically connected to a power supply at a point between the power supply and logic circuitry. The plurality of capacitors exhibit a plurality of different capacitance values and are configured to independently turn on or off according to a plurality of inputs. Decap calibration circuitry is configured to update the plurality of inputs in response to a determination signal. A voltage detector is configured to detect a voltage at an output of the plurality of capacitors and to compare the output voltage to a reference voltage. The decap calibration device is configured to generate the determination signal in response to the voltage comparison.

10 Claims, 3 Drawing Sheets

DECOUPLING CAPACITANCE CALIBRATION DEVICES AND METHODS FOR DRAM

BACKGROUND

1. Technical Field

The embodiments herein relate to DRAMs, such as a DRAM with a decoupling capacitance calibration circuit.

2. Description of the Prior Art

DRAM operations use varying amounts of supply current according to the processes the DRAM is performing. In order to ensure the DRAM does not experience large voltage drops during normal operations, a decoupling capacitance (decap) corresponding to the highest expected voltage drop is often included in the design. This allows charge to be stored in reserve, which can be used for higher current operations, to reduce demand on the power supply.

With the development of semiconductor technology, however, DRAMs are increasingly being used for lower power operations. In a low power DRAM design, local voltage power domains might be powered down during power down mode. When exiting power down mode, a higher decoupling capacitance may cause the DRAM to take a longer time to power up the local voltage power domains.

SUMMARY

In an embodiment, a DRAM is provided that can utilize a variable amount of decoupling capacitance such that an appropriate amount can be determined for specific operations.

In an embodiment, a decoupling capacitance (decap) calibration device includes a plurality of parallel decoupling capacitors configured to be electrically connected to a power supply at a point between the power supply and logic circuitry. The plurality of capacitors exhibit a plurality of different capacitance values and are configured to independently turn on or off according to a plurality of inputs. Decap calibration circuitry is configured to update the plurality of inputs in response to a determination signal. A voltage detector is configured to detect a voltage at an output of the plurality of capacitors and to compare the output voltage to a reference voltage. The decap calibration device is configured to generate the determination signal in response to the voltage comparison.

In another embodiment, a decoupling capacitance (decap) calibration method for a DRAM includes providing a plurality of parallel decoupling capacitors with a voltage from a power supply, the plurality of capacitors exhibiting a plurality of different capacitance values. The method includes providing the plurality of capacitors with a plurality of respective bitstate inputs, the plurality of bitstate inputs independently turning on or off the individual capacitors. A reference voltage is generated and a voltage at an output of the plurality of capacitors is compared with the reference voltage to enable generating a determination signal. The plurality of bitstate inputs are selectively updated in response to the determination signal.

In a further embodiment, a decoupling capacitance (decap) calibration method for a DRAM includes a plurality of parallel decoupling capacitors receiving a supply voltage. The plurality of capacitors are electrically connected to logic circuitry and the plurality of capacitors exhibit a plurality of different capacitance values, wherein individual capacitors are independently turned on or off according to a plurality of bitstate inputs. Decap bitstate calibration circuitry selectively update the plurality of bitstate inputs in response to a determination signal. The method includes a voltage detector electrically connected to the plurality of capacitors and the decap bitstate calibration circuitry receiving a reference voltage and a voltage at an output of the plurality of capacitors and comparing the voltages to enable generating the determination signal.

In a still further embodiment, a decoupling capacitance (decap) calibration device for a DRAM includes a power supply and logic circuitry, the power supply being configured to provide a voltage to the logic circuitry. A plurality of switched, parallel decoupling capacitors are electrically connected to the power supply at a point between the power supply and the logic circuitry, the plurality of capacitors exhibiting a plurality of different capacitance values and being configured to independently switch on or off according to a plurality of bitstate inputs. Decap bitstate calibration circuitry is configured to update the plurality of bitstate inputs in response to a determination signal. The device includes a voltage detector electrically connected to the power supply at a point between the plurality of capacitors and electrically connected to the decap bitstate calibration circuitry, the voltage detector being configured to detect a voltage at an output of the plurality of capacitors and to compare the output voltage to a reference voltage. Fail determination circuitry is electrically connected between the voltage detector and the decap bitstate calibration circuitry, the fail determination circuitry being configured to generate the determination signal in response to the voltage comparison.

These and other embodiments will be apparent to those of ordinary skill in the art after reading the following detailed description of the preferred embodiment that is illustrated in the various figures and drawings.

DETAILED DESCRIPTION

The embodiments herein use the principle that a DRAM has certain known pattern commands it can perform such as burst read/write, etc. Different commands use different amounts of power, but a testing sequence usually performs patterns that use the highest currents. Operating on this principle, the embodiments can utilize a test sequence for determining the highest amount of capacitance a DRAM may use, and then use this amount as the decoupling capacitance (decap) for the DRAM. In other words, the embodiments calibrate for the highest power operation for a DRAM so that it is known what capacitance may be most beneficial. This calibration operation can be performed while testing the DRAM.

Figure 1:
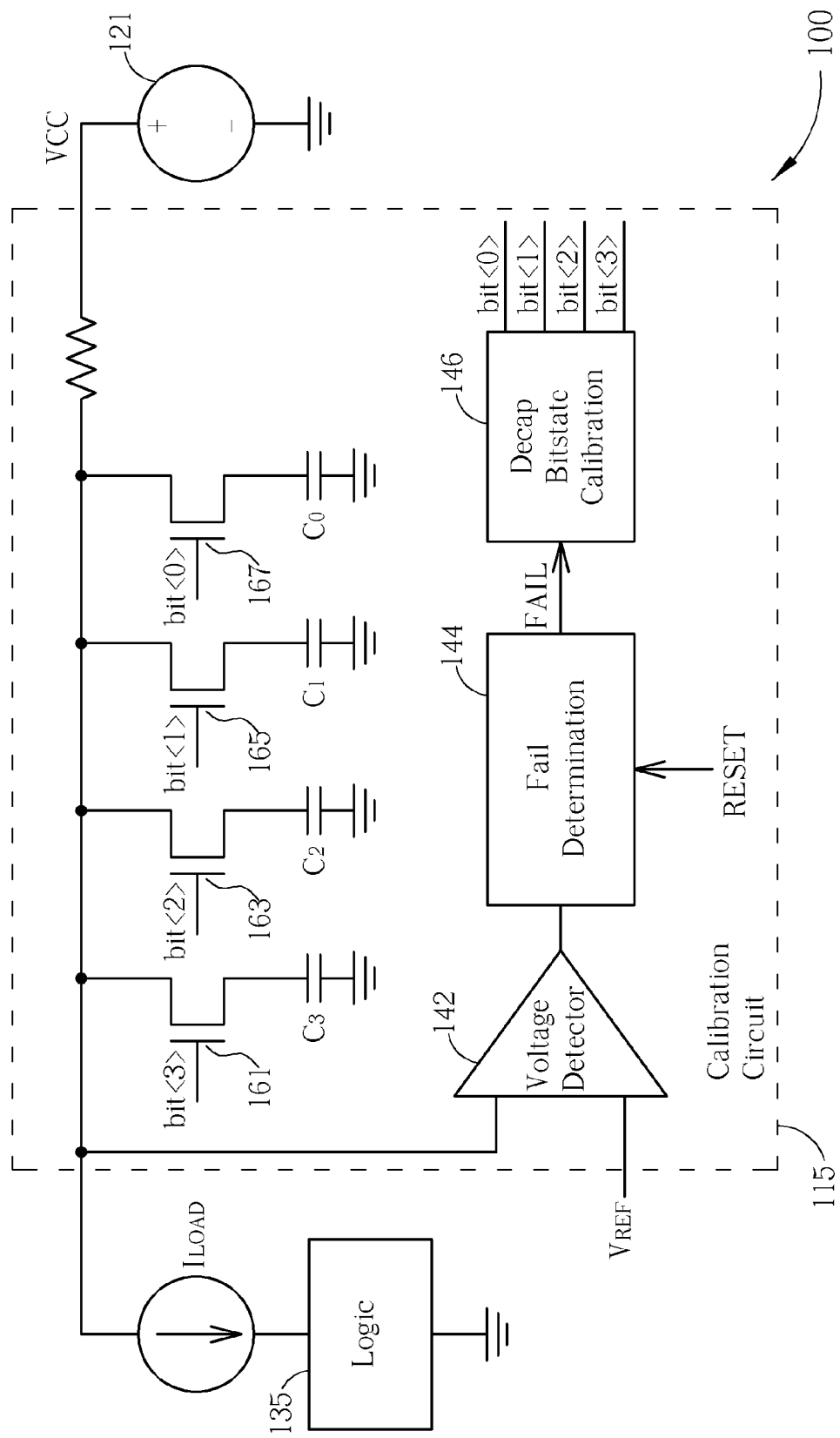
FIG. 1 is a diagram of a decoupling capacitance calibration device for a DRAM according to an embodiment.

Please refer to FIG. 1, which is a diagram of a capacitance calibration circuit 115 for a DRAM system 100 according to an embodiment. As shown in the diagram, the capacitance calibration circuit 115 includes a plurality of capacitors C0, C1, C2, C3 connected in parallel and connected to a logic circuit 135, which can be a DRAM. Each capacitor C0, C1, C2, C3 is further connected in series to a corresponding transistor 161, 163, 165, 167, and the capacitors C0, C1, C2, C3 are all supplied with a supply voltage Vcc. Accordingly, the capacitors C0, C1, C2, C3 may be referred to as switched capacitors. Connected to the output of the capacitors is a voltage detector 142 that receives a voltage from the plurality of capacitors C0, C1, C2, C3 in a first input and receives a reference voltage Vref in a second input. The voltage detector 142 is further connected to a fail determination circuit 144, which is connected in turn to a decap bitstate calibration circuit 146.

In the diagram, each capacitor C0, C1, C2, C3 has a different capacitance value. In this embodiment, these values are, respectively: ⅛C, ¼C, ½C and C. Please note that these values are merely given as an example and a designer may modify the values according to the design specifications. In addition, four capacitors C0, C1, C2, C3 connected in parallel are shown in FIG. 1, but more (or fewer) parallel capacitors may be employed for purposes similar to those of the circuit 115. In such a case, the number of outputs of the decap bitstate calibration circuit 146 may correspond to the number of capacitors; one skilled in the art can perform any appropriate modifications after reading the detailed description.

Initially, all capacitors C0, C1, C2, C3 are turned off and a current is input to the calibration circuit 115. This creates a voltage drop across the DRAM/logic circuit 135. A certain lowest acceptable voltage drop may be expected for the DRAM 135 to have sufficient capacity to perform certain patterns. Therefore, the reference voltage Vref is chosen according to that voltage drop. For example, if the ideal supply voltage is 1.2 Volts (V) and the DRAM/logic circuit 135 can tolerate 200 mV (milliVolts) of drop, Vref might be set to 1.0 V. Both Vref and Vcap (the voltage drop across the DRAM 135) are input to the voltage detector 142 and the two voltages are compared. If the Vcap is below Vref, then that indicates the DRAM 135 may fail. Therefore, the fail determination circuit 144 will output a 'fail' result.

The fail determination circuit 144 is then reset and the first capacitor C0 (⅛C) is turned on and charged by bit <0>. The fail determination circuit 144 will therefore register a capacitor logic result of <0001>; in other words, only C0 (⅛C) is operative. The voltage comparison operation is performed again with the same value of Vref and a new value of Vcap according to the connected capacitor. If the system 100 still fails, the fail determination circuit 144 is reset, C0 is turned off and the C1 (¼C) is charged (i.e. bitstate=<0010>). This continues through bitstates corresponding to successively increasing decap until the voltage drop across the DRAM 135 is equal to or greater than Vref. The decap bitstate calibration circuit 146 can thereby determine which combination of capacitors C0, C1, C2, C3 are charged for the 'pass' operation and therefore correctly determine an amount of decoupling capacitance for a DRAM 135 operation.

The testing might all be done in one test pattern that comprises a combination of DRAM command sequences that use the most power. As may be appreciated by those skilled in the art, there are many possible capacitor combinations, e.g. <0000>, <0001>, <0010>, <0011>, <0100>, <0101> etc. and, therefore, the calibration circuit 115 shown in FIG. 1 can successfully fine-tune an amount of decoupling capacitance for all DRAM operations. As detailed above, the number of capacitors and the size of the capacitance used are not limited. One consideration for a designer is to choose a high enough value of C so that the calibration circuit 115 can provide sufficient power. In addition, a RESET signal may be generated for each test pattern that yields a 'fail' result.

Figure 2:
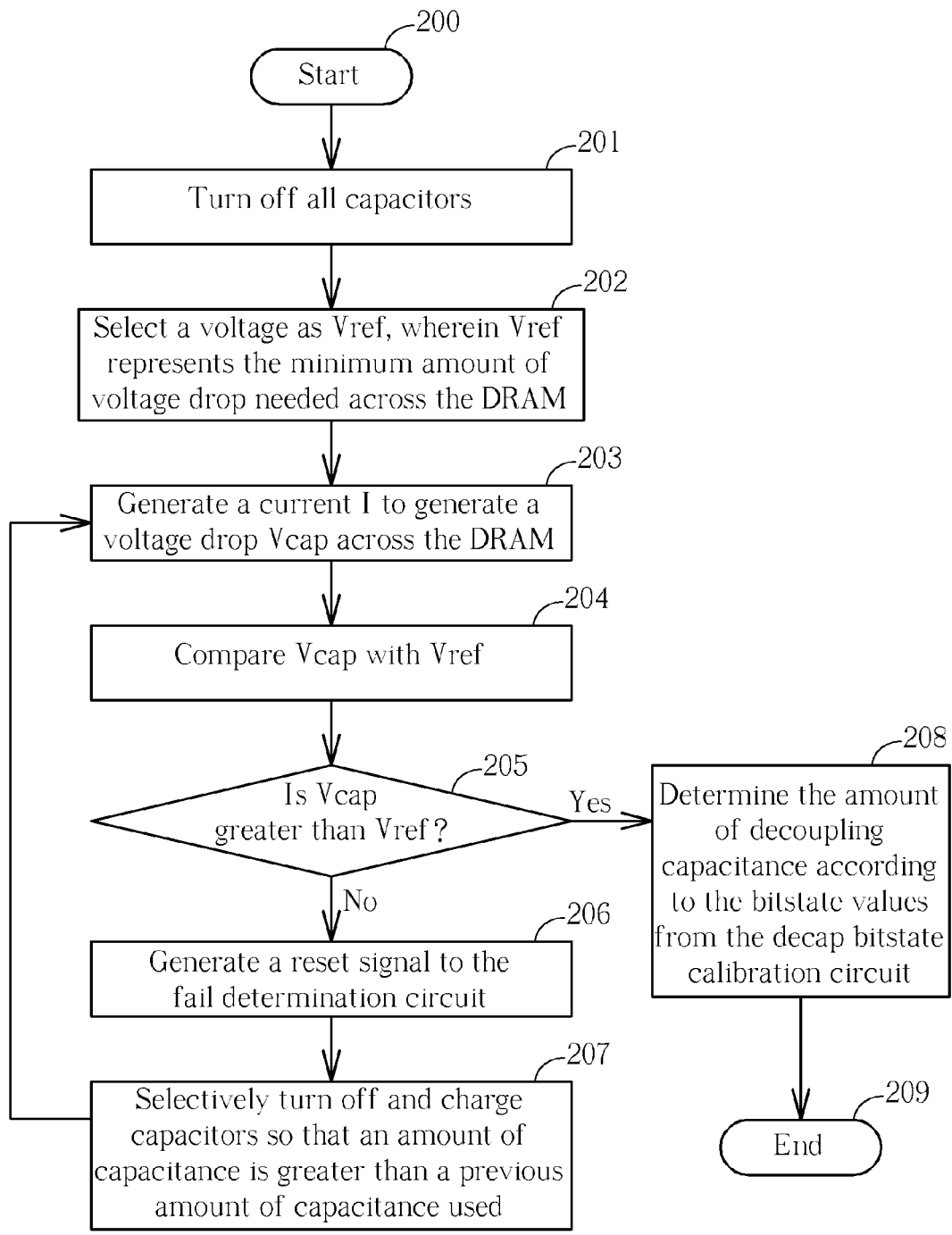
FIG. 2 is a flowchart detailing a method of performing the decoupling capacitance calibration operation according to an embodiment.

A representation of a method according to another embodiment is shown in FIG. 2. The steps of the method are also provided in the following description.

Step 200: Start;
Step 201: Turn off all capacitors;
Step 202: Select a voltage as Vref, wherein Vref represents the minimum amount of voltage drop needed across the DRAM;
Step 203: Generate a current I to generate a voltage drop Vcap across the DRAM;
Step 204: Compare Vcap with Vref;
Step 205: Is Vcap greater than Vref? If yes, go to Step 208, if no go to Step 206;
Step 206: Generate a reset signal to the fail determination circuit;
Step 207: Selectively turn off and charge capacitors so that an amount of capacitance is greater than a previous amount of capacitance used. Return to Step 203;
Step 208: Determine the amount of decoupling capacitance according to the bitstate values from the decap bitstate calibration circuit;
Step 209: End.

HYPOTHETICAL EXAMPLE

Figure 3:
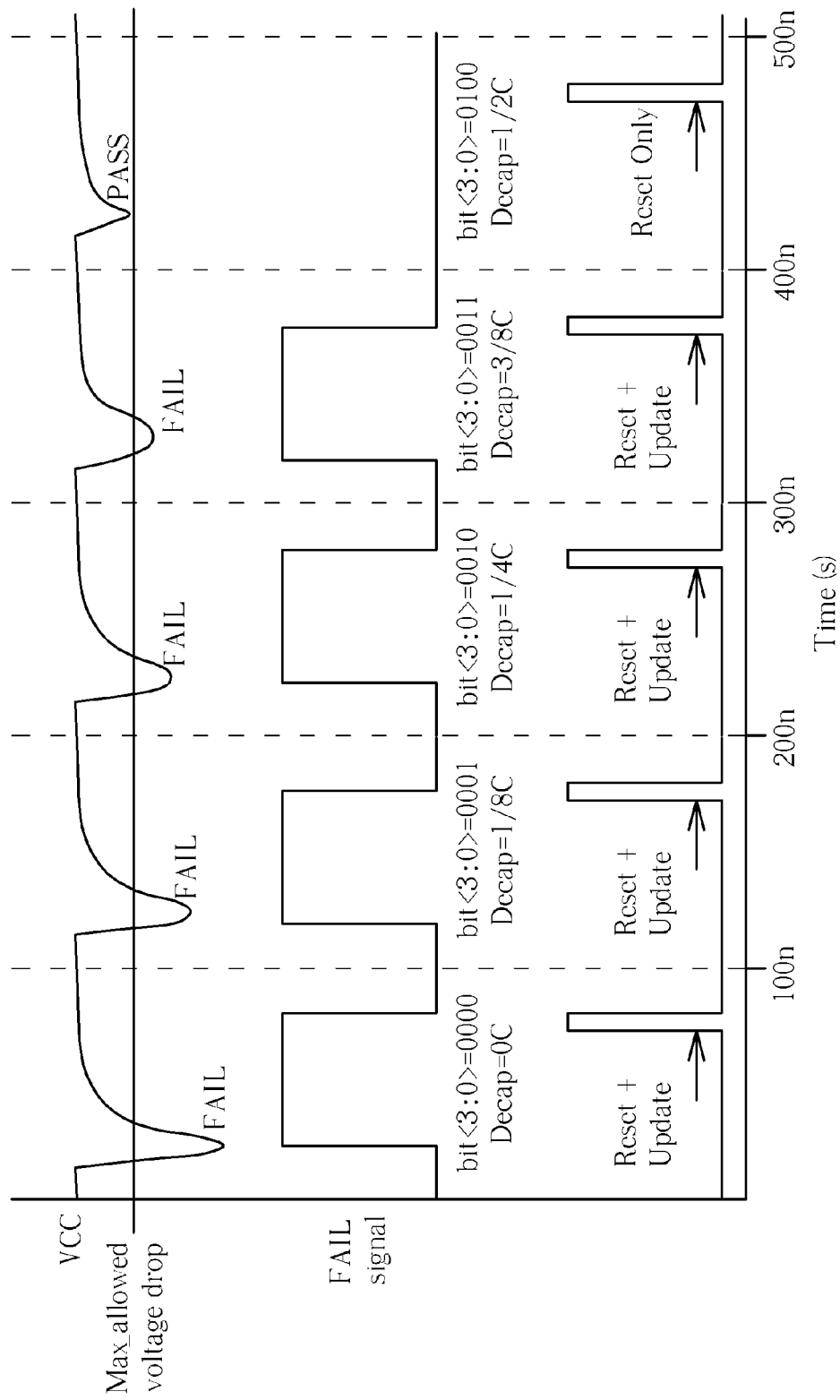
FIG. 3 is a graph of component waveforms during operation of components in a device according to FIG. 1.

FIG. 3 shows a graph of component waveforms during operation of components in a hypothetical device according to FIG. 1. In a first cycle, the bitstates are 0000 and there is no decoupling capacitance. When a high current pattern is applied, the power supply voltage, Vcc, drops well below the maximum allowed voltage drop target of 1.0V. Since a fail occurs, the bits are updated to 0001 and more decoupling capacitance is added. The pattern is then applied again and a fail still occurs, requiring another update to bitstate 0010, which adds more decoupling capacitance. This continues until bitstate 0100 is reached and, at that point, enough decoupling capacitance is added to achieve target voltage drop values.

Referring to FIG. 1, if the value of C in the Hypothetical Example is 2 nF, the maximum amount of decoupling capacitance that can be seen (bitstate 1111) is 3.75 nF if all capacitors are turned on. The calibration device determines that ½C is enough to satisfy the voltage drop target. In other words, 1 nF total is used. If all decoupling capacitance is turned on, the system has 2.75 nF of excess decoupling capacitance. This extra capacitance would make it extremely difficult to power up the supply voltage following a powerdown exit when the supply voltage is 0V. Calibrating allows the system to satisfy voltage drop expectations without extra decoupling capacitance that may hamper the supply powering back up.

Therefore, the embodiments provide a calibration device in a DRAM system and a related calibration method for precisely determining an amount of decoupling capacitance suitable for DRAM operations, wherein the calibration method can be performed during test operations for a DRAM.

Those skilled in the art will readily observe that numerous modifications and alterations of the device and method may be made while retaining the teachings of the embodiments.

What is claimed is:

1. A decoupling capacitance (decap) calibration method for a DRAM, comprising:
    a plurality of parallel decoupling capacitors receiving a supply voltage, the plurality of capacitors being electrically connected to logic circuitry and the plurality of capacitors exhibiting a plurality of different capacitance values, wherein individual capacitors are independently turned on or off according to a plurality of bitstate inputs;
    decap bitstate calibration circuitry selectively updating the plurality of bitstate inputs in response to a determination signal;

a voltage detector electrically connected to the plurality of capacitors and the decap bitstate calibration circuitry receiving a reference voltage and a voltage at an output of the plurality of capacitors and comparing the voltages to enable generating the determination signal, wherein when the voltage at the output of the plurality of capacitors is less than the reference voltage, an output of the voltage detector will undergo a level transformation; and fail determination circuitry electrically connected between the voltage detector and the decap bitstate calibration circuitry, the fail determination circuitry generating a 'fail' determination signal in response to the level transformation.

2. The decap calibration method of claim 1, wherein the decap bitstate calibration circuitry initially sets all bitstates of the plurality of capacitors to zero, and each time the decap bitstate calibration circuitry receives the 'fail' determination signal, the decap bitstate calibration circuitry binarily updates the bitstates of the plurality of capacitors.

3. The decap calibration method of claim 2, wherein a reset signal is sent to the fail determination circuitry each time the decap bitstate calibration circuitry binarily updates the bitstates of the plurality of capacitors.

4. The decap calibration method of claim 1, wherein when the voltage at the output of the plurality of capacitors is more than the reference voltage, the fail determination circuitry generates a 'pass' determination signal and an amount of decoupling capacitance provided by the plurality of capacitors according to the plurality of bitstate inputs is maintained.

5. A decoupling capacitance (decap) calibration method for a DRAM, comprising:
   providing a plurality of parallel decoupling capacitors with a voltage from a power supply, the plurality of capacitors exhibiting a plurality of different capacitance values;
   providing the plurality of capacitors with a plurality of respective bitstate inputs, the plurality of bitstate inputs independently turning on or off the individual capacitors;
   generating a reference voltage;
   comparing a voltage at an output of the plurality of capacitors with the reference voltage to enable generating a determination signal, comprising:
      when the voltage at the output of the plurality of capacitors is less than the reference voltage, generating a 'fail' determination signal; and
   selectively updating the plurality of bitstate inputs in response to the determination signal.

6. The decap calibration method of claim 5, wherein the providing of the plurality of capacitors with a plurality of respective bitstate inputs comprises:
   initially setting all bitstate inputs to zero;
   and the updating of the plurality of bitstate inputs in response to the determination signal comprises:
   when the 'fail' determination signal is generated, binarily updating the bitstate inputs of the plurality of capacitors.

7. The decap calibration method of claim 6, wherein the updating of the bitstate inputs of the plurality of capacitors further comprises:
   generating a reset signal for resetting the 'fail' determination signal.

8. The decap calibration method of claim 5, wherein the comparing of the voltage at the output of the plurality of capacitors with the reference voltage to enable generating a determination signal comprises:
   when the voltage at the output of the plurality of capacitors is more than the reference voltage, generating a 'pass' determination signal; and
   maintaining an amount of decoupling capacitance provided by the plurality of capacitors according to the plurality of bitstate inputs.

9. A decoupling capacitance (decap) calibration device for a DRAM, comprising:
   a plurality of parallel decoupling capacitors configured to be electrically connected to a power supply at a point between the power supply and logic circuitry, the plurality of capacitors exhibiting a plurality of different capacitance values and being configured to independently turn on or off according to a plurality of inputs;
   decap calibration circuitry configured to update the plurality of inputs in response to a determination signal;
   a voltage detector configured to detect a voltage at an output of the plurality of capacitors and to compare the output voltage to a reference voltage, the decap calibration device being configured to generate the determination signal in response to the voltage comparison, wherein when the output voltage is less than the reference voltage, an output of the voltage detector will undergo a level transformation; and
   fail determination circuitry configured to generate a 'fail' determination signal in response to the level transformation.

10. A decoupling capacitance (decap) calibration device for a DRAM, comprising:
   a power supply and logic circuitry, the power supply being configured to provide a voltage to the logic circuitry;
   a plurality of switched, parallel decoupling capacitors electrically connected to the power supply at a point between the power supply and the logic circuitry, the plurality of capacitors exhibiting a plurality of different capacitance values and being configured to independently switch on or off according to a plurality of bitstate inputs;
   decap bitstate calibration circuitry configured to update the plurality of bitstate inputs in response to a determination signal;
   a voltage detector electrically connected to the power supply at a point between the plurality of capacitors and electrically connected to the decap bitstate calibration circuitry, the voltage detector being configured to detect a voltage at an output of the plurality of capacitors and to compare the output voltage to a reference voltage, wherein when the output voltage is less than the reference voltage, an output of the voltage detector will undergo a level transformation; and
   fail determination circuitry electrically connected between the voltage detector and the decap bitstate calibration circuitry, the fail determination circuitry being configured to generate the determination signal in response to the voltage comparison, wherein when an output of the voltage detector undergoes a level transformation, the fail determination circuitry will generate a 'fail' determination signal.

* * * * *